US010879368B2

(12) United States Patent
Teo et al.

(10) Patent No.: US 10,879,368 B2
(45) Date of Patent: Dec. 29, 2020

(54) TRANSISTOR WITH MULTI-METAL GATE

(71) Applicant: Mitsubishi Electric Research Laboratories, Inc., Cambridge, MA (US)

(72) Inventors: Koon Hoo Teo, Lexington, MA (US); Nadim Chowdhury, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 15/785,625

(22) Filed: Oct. 17, 2017

(65) Prior Publication Data

US 2019/0115442 A1  Apr. 18, 2019

(51) Int. Cl.
| | |
|---|---|
| *H01L 29/49* | (2006.01) |
| *H01L 29/417* | (2006.01) |
| *H01L 29/786* | (2006.01) |
| *H01L 29/10* | (2006.01) |
| *H01L 29/20* | (2006.01) |
| *H01L 29/205* | (2006.01) |
| *H01L 29/778* | (2006.01) |
| *H01L 21/306* | (2006.01) |
| *H01L 21/3213* | (2006.01) |
| *H01L 21/28* | (2006.01) |
| *H01L 29/16* | (2006.01) |
| *H01L 29/24* | (2006.01) |
| *H01L 21/04* | (2006.01) |

(Continued)

(52) U.S. Cl.
CPC ........ *H01L 29/4983* (2013.01); *H01L 21/044* (2013.01); *H01L 21/28264* (2013.01); *H01L 21/30604* (2013.01); *H01L 21/30612* (2013.01); *H01L 21/32139* (2013.01); *H01L 21/441* (2013.01); *H01L 21/465* (2013.01); *H01L 29/1033* (2013.01); *H01L 29/1606* (2013.01); *H01L 29/2003* (2013.01); *H01L 29/205* (2013.01); *H01L 29/24* (2013.01); *H01L 29/41775* (2013.01); *H01L 29/475* (2013.01); *H01L 29/66045* (2013.01); *H01L 29/66462* (2013.01); *H01L 29/66969* (2013.01); *H01L 29/778* (2013.01); *H01L 29/7783* (2013.01); *H01L 29/7786* (2013.01); *H01L 29/78696* (2013.01); *H01L 29/1066* (2013.01)

(58) Field of Classification Search
CPC ............. H01L 29/1033; H01L 29/1606; H01L 29/2003; H01L 29/205; H01L 29/24; H01L 29/41775; H01L 29/4983; H01L 29/66045; H01L 29/66462; H01L 29/66969; H01L 29/7783; H01L 29/78696
See application file for complete search history.

(56) References Cited

U.S. PATENT DOCUMENTS

| | | | |
|---|---|---|---|
| 6,404,022 B1 | 6/2002 | Blair et al. | |
| 7,081,663 B2 * | 7/2006 | Bulucea | H01L 27/0808 |
| | | | 257/595 |

(Continued)

*Primary Examiner* — Peniel M Gumedzoe
(74) *Attorney, Agent, or Firm* — Gennadiy Vinokur; James McAleenan; Hironori Tsukamoto

(57) ABSTRACT

A transistor includes a gate electrode with multiple metals distributed along the width of the gate electrode. Each of the metals in the gate electrode has different work functions. Such a compound gate provides higher linearity when, e.g., operated as a radio frequency transistor.

11 Claims, 20 Drawing Sheets

(51) Int. Cl.
*H01L 21/441* (2006.01)
*H01L 21/465* (2006.01)
*H01L 29/66* (2006.01)
*H01L 29/47* (2006.01)

(56) References Cited

U.S. PATENT DOCUMENTS

| | | |
|---|---|---|
| 7,253,454 B2 | 8/2007 | Saxler |
| 8,242,581 B1 * | 8/2012 | Ratnakumar ....... H01L 29/4983 |
| | | 257/312 |
| 8,698,245 B2 * | 4/2014 | Anderson ......... H01L 21/26506 |
| | | 257/347 |
| 2001/0017390 A1 * | 8/2001 | Long ................ H01L 21/28105 |
| | | 257/368 |
| 2005/0141281 A1 * | 6/2005 | Jung ................ G11C 16/0425 |
| | | 365/185.23 |
| 2006/0060871 A1 | 3/2006 | Beach et al. |
| 2009/0032889 A1 * | 2/2009 | Zhu ................ H01L 21/28105 |
| | | 257/410 |
| 2009/0309162 A1 | 12/2009 | Baumgartner et al. |
| 2010/0044801 A1 * | 2/2010 | Anderson ......... H01L 21/28105 |
| | | 257/372 |
| 2012/0025874 A1 * | 2/2012 | Saikaku ............. H01L 29/1095 |
| | | 327/109 |
| 2013/0020651 A1 * | 1/2013 | Zhu ................ H01L 21/82385 |
| | | 257/369 |
| 2001/4011075 | 4/2014 | Murata et al. |
| 2016/0181364 A1 | 6/2016 | Stewart et al. |
| 2018/0374943 A1 * | 12/2018 | Liu .................... H01L 29/7787 |

* cited by examiner

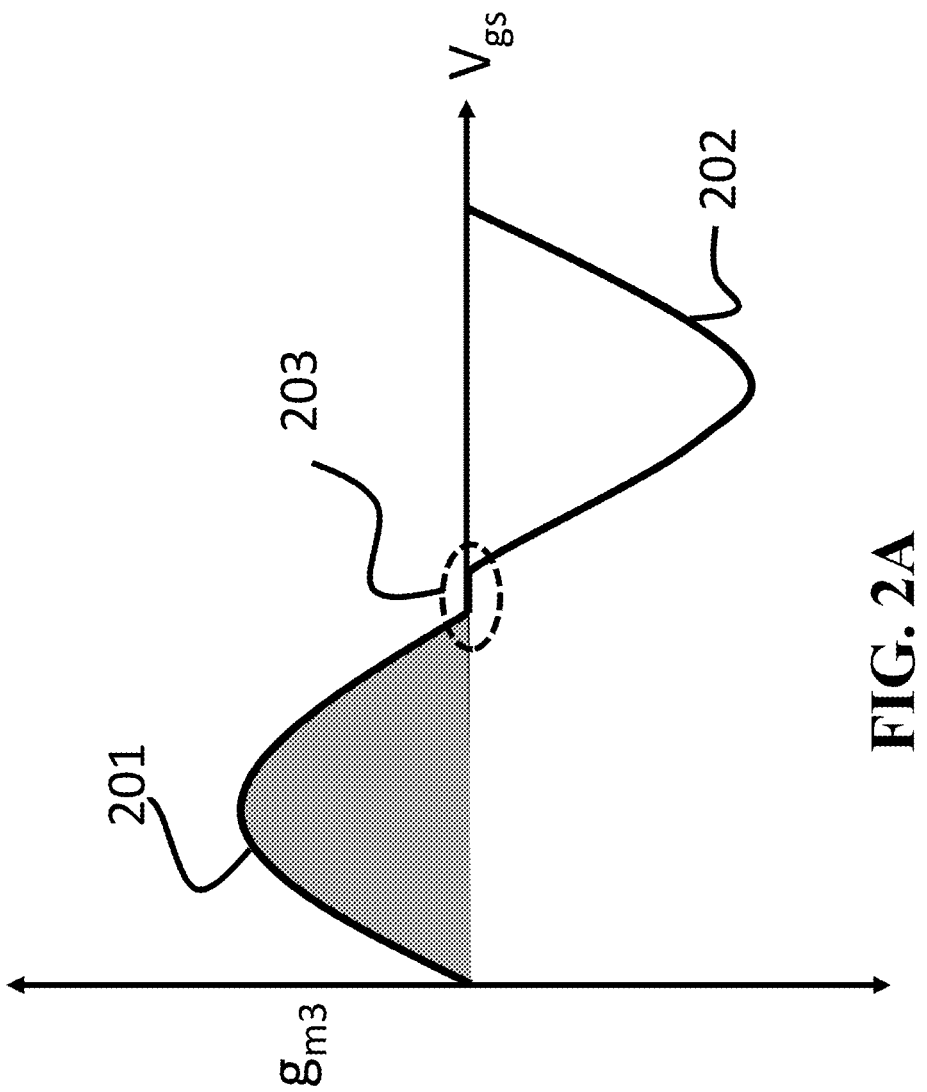

TRANSISTOR WITH MULTI-METAL GATE

TECHNICAL FIELD

The present invention relates generally to semiconductor device such as high electron mobility transistors for high frequency applications.

BACKGROUND

Materials such as silicon (Si) and gallium arsenide (GaAs) have found wide application in semiconductor devices. These, more familiar, semiconductor materials may not be well suited for higher power and/or high frequency applications, however, because of their relatively small bandgaps (e.g., 1.12 eV for Si and 1.42 for GaAs at room temperature) and/or relatively small breakdown voltages. In light of the difficulties presented by Si and GaAs, interest in high power, high temperature and/or high frequency applications and devices has turned to wide bandgap semiconductor materials such as silicon carbide (2.996 eV for alpha SiC at room temperature) and the Group III nitrides (e.g., 3.36 eV for GaN at room temperature). These materials, typically, have higher electric field breakdown strengths and higher electron saturation velocities as compared to gallium arsenide and silicon.

A device of particular interest for high power and/or high frequency applications is the High Electron Mobility Transistor (HEMT), which, in certain cases, is also known as a modulation doped field effect transistor (MODFET). These devices may offer operational advantages under a number of circumstances because a two-dimensional electron gas (2DEG) is formed at the heterojunction of two semiconductor materials with different bandgap energies, and where the smaller bandgap material has a higher electron affinity. The 2DEG is an accumulation layer in the undoped ("unintentionally doped"), smaller bandgap material and can contain a very high sheet electron concentration in excess of, for example, $10^{13}$ cm$^{-2}$. Additionally, electrons that originate in the wider-bandgap semiconductor transfer to the 2DEG, allowing a high electron mobility due to reduced ionized impurity scattering.

This combination of high carrier concentration and high carrier mobility can increase transconductance of the HEMT and may provide a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of RF power because of the combination of material characteristics that includes the aforementioned high breakdown fields, their wide bandgaps, large conduction band offset, and/or high saturated electron drift velocity.

One of the performance metric for RF transistor is the linearity. A transistor with high linearity consumes lower power when used is Low Noise Amplifier (LNA) or Power Amplifier (PA). Currently the problem of linearity in a power amplifier is solved at the circuit level by employing various linearization techniques, such as derivative superposition, however, usage of these techniques is expensive. Hence, there is a need to design a transistor with high linearity and higher power density.

SUMMARY

Some embodiments are based on recognition that the linearity of a transistor depends on the increase of transconductance with respect to the gate voltage. A gradual increase of transconductance yields high linearity whereas a rapid increase of transconductance results in low linearity. The graduality of transconductance is dictated by the structure and the property of the material forming the transistor, and is challenging to control.

For example, different materials can be used to form a gate of the transistor, but properties of various metals suitable to modulate the conductivity of the carrier channel result in relatively low linearity. Additionally, or alternatively, the linearity can be increased by reducing the width of the gate of the transistor. However, such a reduction also reduces carrier density, which is undesirable.

Some embodiments are based on realization that reduction of the width of the gate can be compensated with different metals restoring the width to the dimensions desired for the target carrier density. Each metal in such a composite multi-metal gate structure has a reduced gate-width and thus improved linearity. In addition, different metals have different work functions resulting in different voltage thresholds governing variation of the drain current with respect to the gate voltage. Hence, the drain currents induced by different metals interfere with each. Thus, by changing the type and the dimensions of different slabs of the metals, it is possible to use such an interference to improve the total linearity of a transistor. In fact, our simulations show that widths reduction and the interference improves the linearity of the transistor for various tested arrangements and selection of different materials suitable to function as part of the compound gate.

To that end, in some embodiments, the gate of transistor includes at least two slabs of different metals arranged in parallel to each other along the width of the gate. Such an arrangement allows the slabs to form multiple virtual channels under the same gate region. Although these virtual channels connect the same source and the drain, they are referred herein as virtual channels due to slightly different threshold voltage values.

Accordingly, some embodiments disclose a transistor including a semiconductor structure; a source and a drain arranged on the semiconductor structure; and a gate arranged between the source and the drain. The gate includes at least two slabs of different metals arranged in parallel to each other along the width of the gate.

Examples of the transistor include high electron mobility transistors (HEMTs) in which the semiconductor structure includes multiple layers to form a carrier channel passing carriers from the source to the drain when the voltage is applied to the gate. The transistor according to some embodiments can be used in low-noise amplifier, power amplifier, radio frequency electronics and digital electronics, among others.

In some implementations, the transistor also includes a layer of metal arranged on top of the slabs of different metals. Such a layer of metal simplifies the concurrent control of the slabs. For example, in some implementations, the slabs do not touch each other, and the concurrent control of the slabs is achieved with help of the layer of metal. In alternative embodiment, the slabs touch each other along the sides forming the gate-length.

Additionally, or alternatively, different embodiments can vary dimensions, a number of the slabs, material and arrangements of the slabs. For example, in one embodiment, the slabs have identical gate-length and/or gate-width. In alternative embodiment, the slabs have different gate-length and/or gate-width. For example, in some embodiments, the selection and arrangement of different metals are such that the work functions of the metals gradually vary along the width of the compound gate. However, in alternative embodiment, the work functions of the selected material of the slabs vary arbitrarily.

In some implementations, the slabs of different metals are arranged on top of the semiconductor structure. In different implementations, the transistor includes an oxide layer or a semiconductor arranged on top of the semiconductor structure, and the slabs of different metals are arranged on top of the oxide or semiconductor layer.

In some embodiments, the transistor is adapted for radio-frequency (RF) applications. To that end, in some embodiments, the mutual geometrical arrangement of the source, the drain, and the gate is selected for amplifying RF signals. For example, in one implementation, a distance between the source and the gate of the transistor is greater than a distance between the gate and the drain.

BRIEF DESCRIPTION OF THE DRAWINGS

FIGS. 2A and 2B show plots illustrating how a gate electrode including multiple metal slabs arranged along the width of the device improves the linearity of a semiconductor device.

DETAILED DESCRIPTION OF THE PREFERRED EMBODIMENTS

Figure 1A:
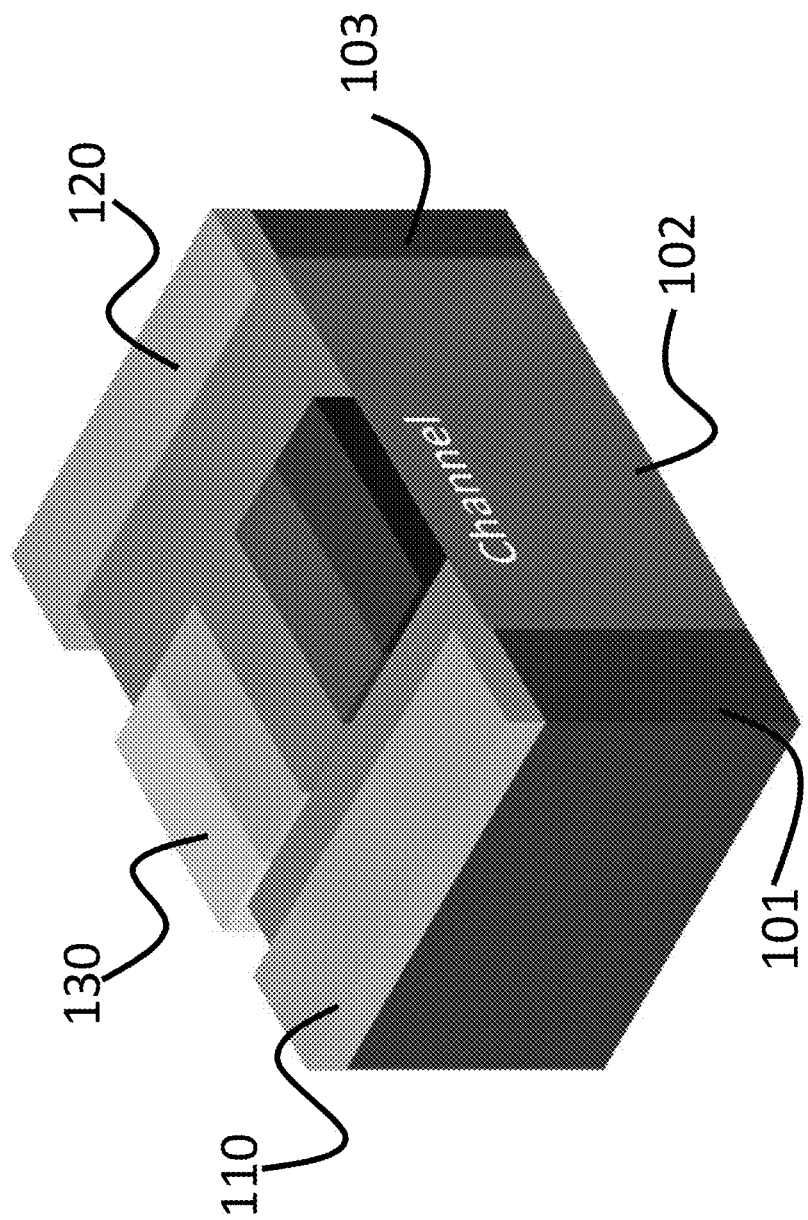
FIG. 1A shows the 3-Dimensional schematic of a transistor according to one embodiment.

FIG. 1A shows the 3-Dimensional schematic of a transistor according to one embodiment. The transistor includes a semiconductor structure having heavily doped source 101 and drain 103 regions arranged on the two opposite sides a channel region 102. The source and the drain regions are doped with same impurity type, however the channel region is lightly doped with impurities having a conductivity type opposite to the conductivity type of source and the drain regions.

For example, for an n-type transistor the source and the drain regions are doped with n type dopants whereas the channel region is doped with p-type dopants. On the other hand, for p-type transistor, the source and the drain regions are doped heavily with p-type dopants and the channel region is lightly doped with n-type dopants.

Source electrode 110 and drain electrode 120 are formed on top of source and drain regions respectively. A gate electrode 130 is arranged between the source and the drain electrodes and on top of channel region 102 which provides the carrier channel when a voltage is applied at the gate. The gate electrode includes at least two slabs of different metals arranged in parallel to each other along the direction of the width of the gate.

Figure 1B:
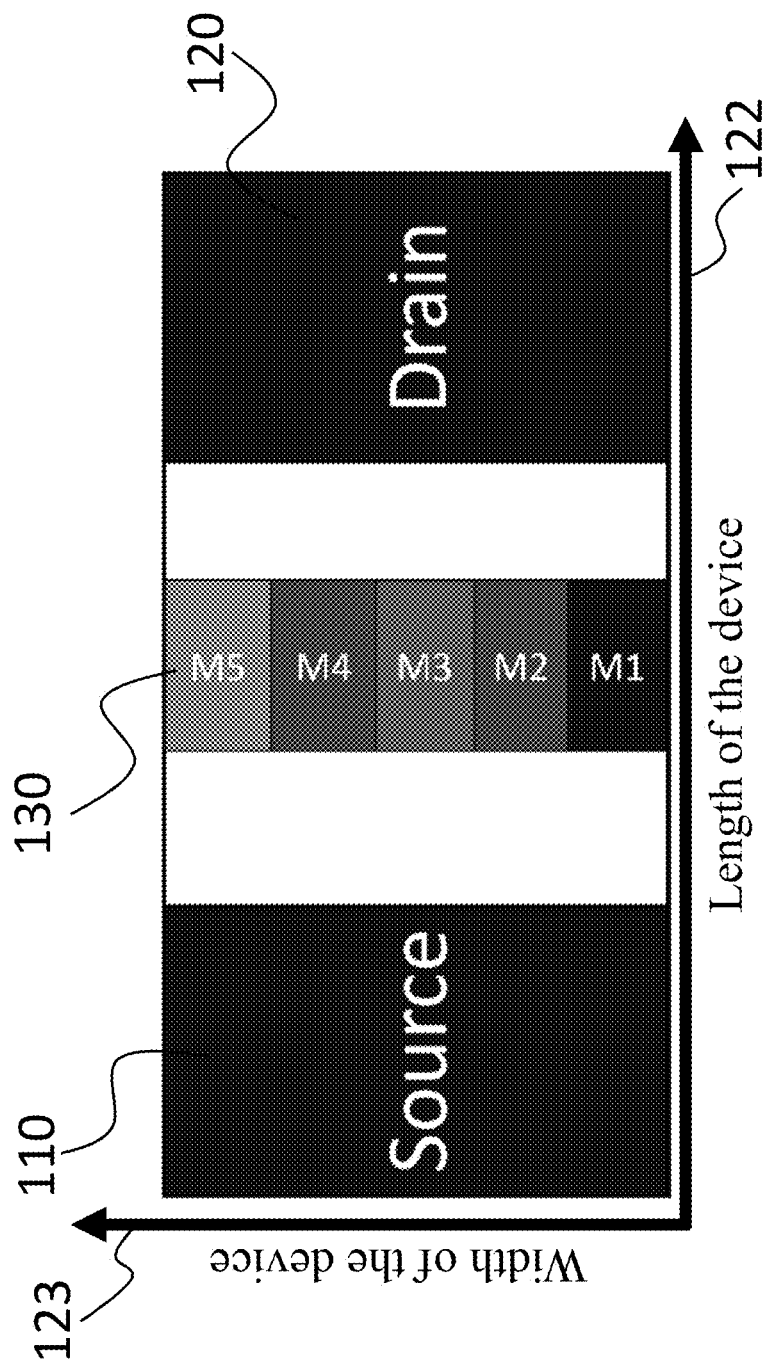
FIG. 1B shows the top view of the transistor of FIG. 1A.

FIG. 1B shows the top view of the transistor of FIG. 1A. As exhibited in this figure the top plane has two directions. One direction 122 is along the length of the gate electrode and the length of the transistor (i.e. from the source electrode towards the drain electrode) and the other direction 123 is along the width of the gate electrode and the width of the transistor. In some embodiments, the gate electrode includes multiple metals are arranged along the width of the gate electrode (and the width of the transistor).

Figure 1C:
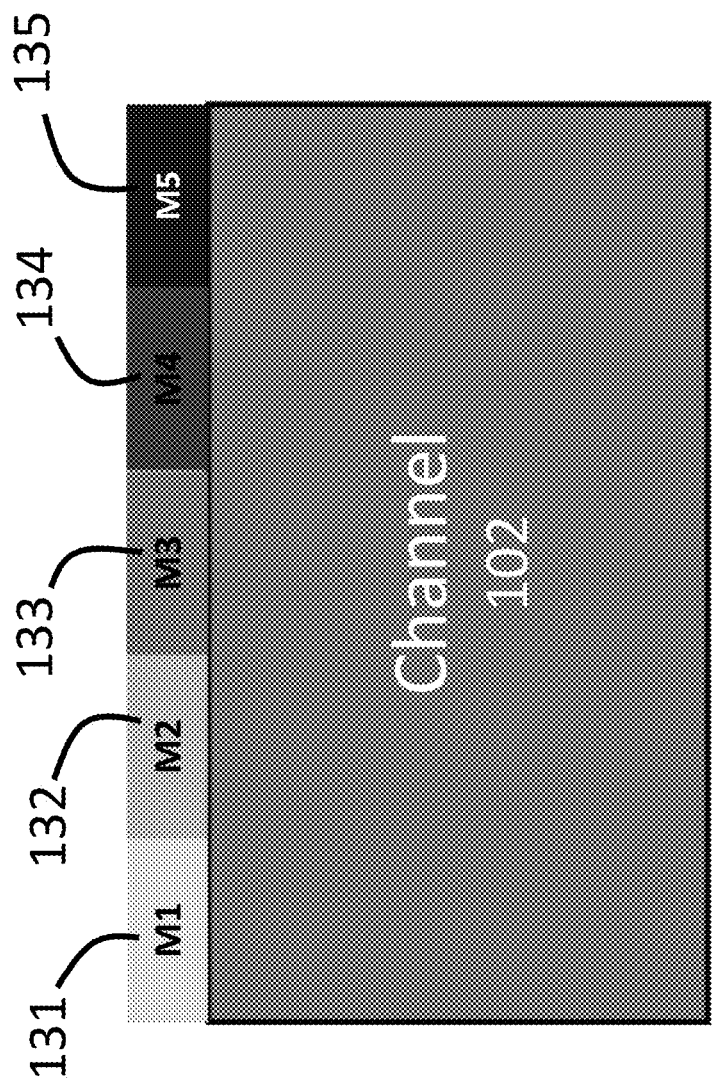
FIG. 1C shows the cross section view in the middle of the channel along the width of the device according to some embodiments.

FIG. 1C shows the cross section view in the middle of the channel along the width of the device according to some embodiments. This view demonstrates that the multiple metals of the gate electrode are arranged along the width of the device on top of a semiconductor 102 which forms the channel. As shown in this figure, the gate includes different metals 131, 132, 133, 134, and 135. Here for the demonstration purpose only five different metals are shown in the figure. However, in principle the higher the number of metals the better would be linearity performance of the device. These metals are selected to have different work functions. In different embodiments, the width of different metal slabs can be identical or different. The work functions of the metals could be arranged in an increasing or decreasing order from left to right or they could be randomly distributed. Each metals have different work functions.

Figure 1D:
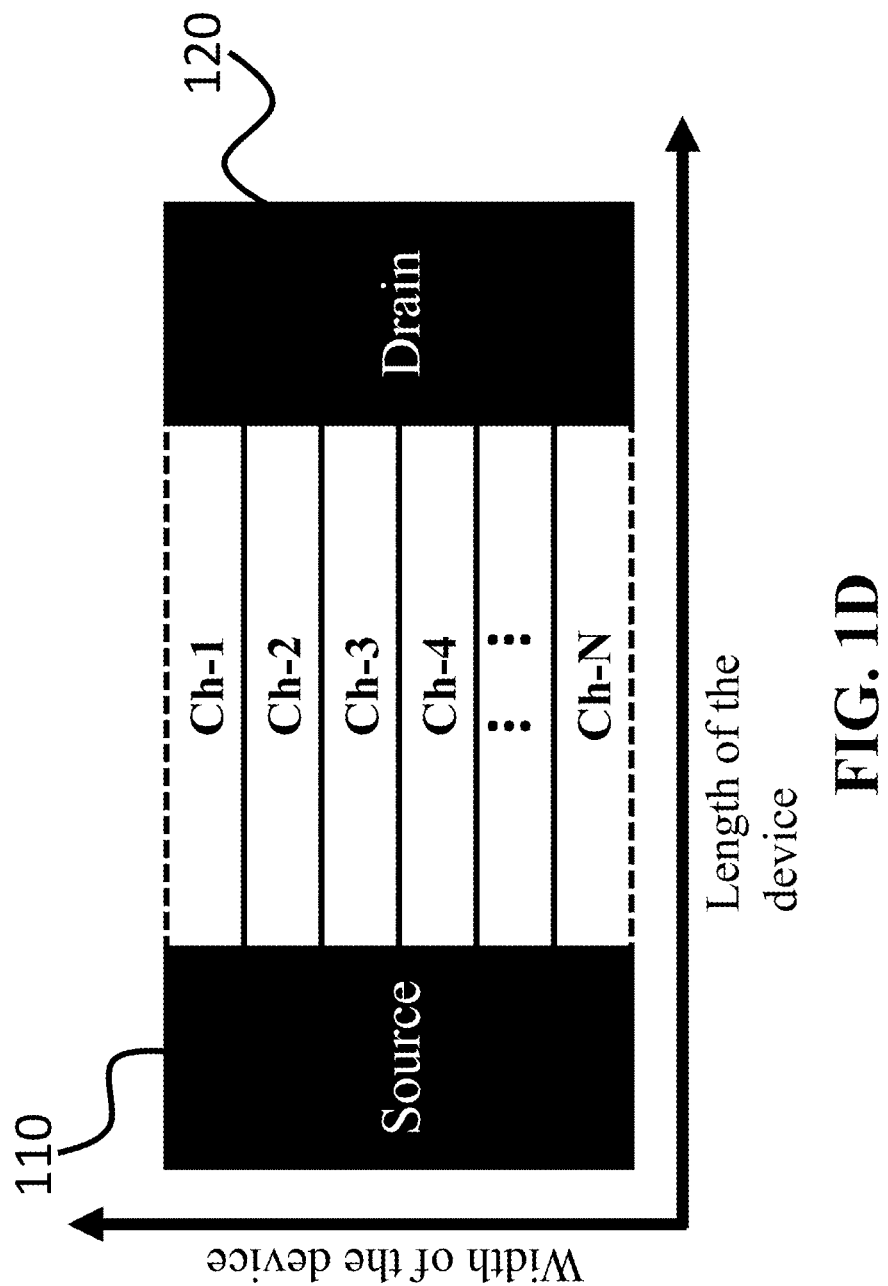
FIG. 1D shows the schematic of how virtual channels Ch-1, Ch-2, . . . Ch-N that are formed in the semiconductor structure between the source and the drain according to some embodiments.

FIG. 1D shows the schematic of how virtual channels Ch-1, Ch-2, . . . Ch-N that are formed in the semiconductor structure between the source and the drain according to some embodiments. Each channel has its own threshold voltage namely, Vth1, Vth2, . . . VthN. The threshold voltages are engineered in such a way that third order transconductance gm3 of one such virtual channel destructively interferes with third order transconductance gm3 of another virtual channel and cancels each other. Thus, the composite device having N such virtual channels is able to provide gm3 close to zero for a very wide range of gate voltage. This phenomenon of destructive interference of gm3 is referred herein as "Derivative Superposition".

Figure 1E:
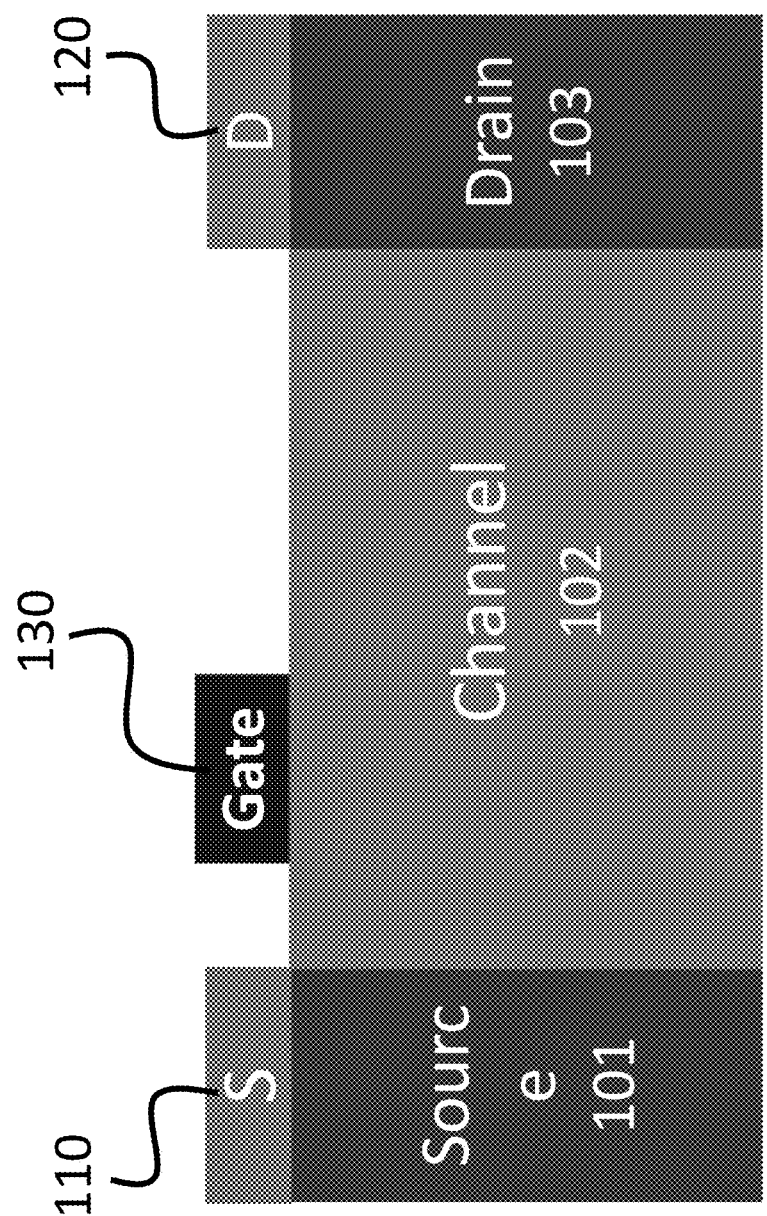
FIG. 1E shows the cross section view along the length of the transistor according to one embodiment.

FIG. 1E shows the cross section view along the length of the transistor according to one embodiment. FIG. 1E demonstrates that the multiple metals are not arranged along the length of the device, i.e., only one slab of metal forming the gate electrode is visible on this cross-section view.

Figure 2B:
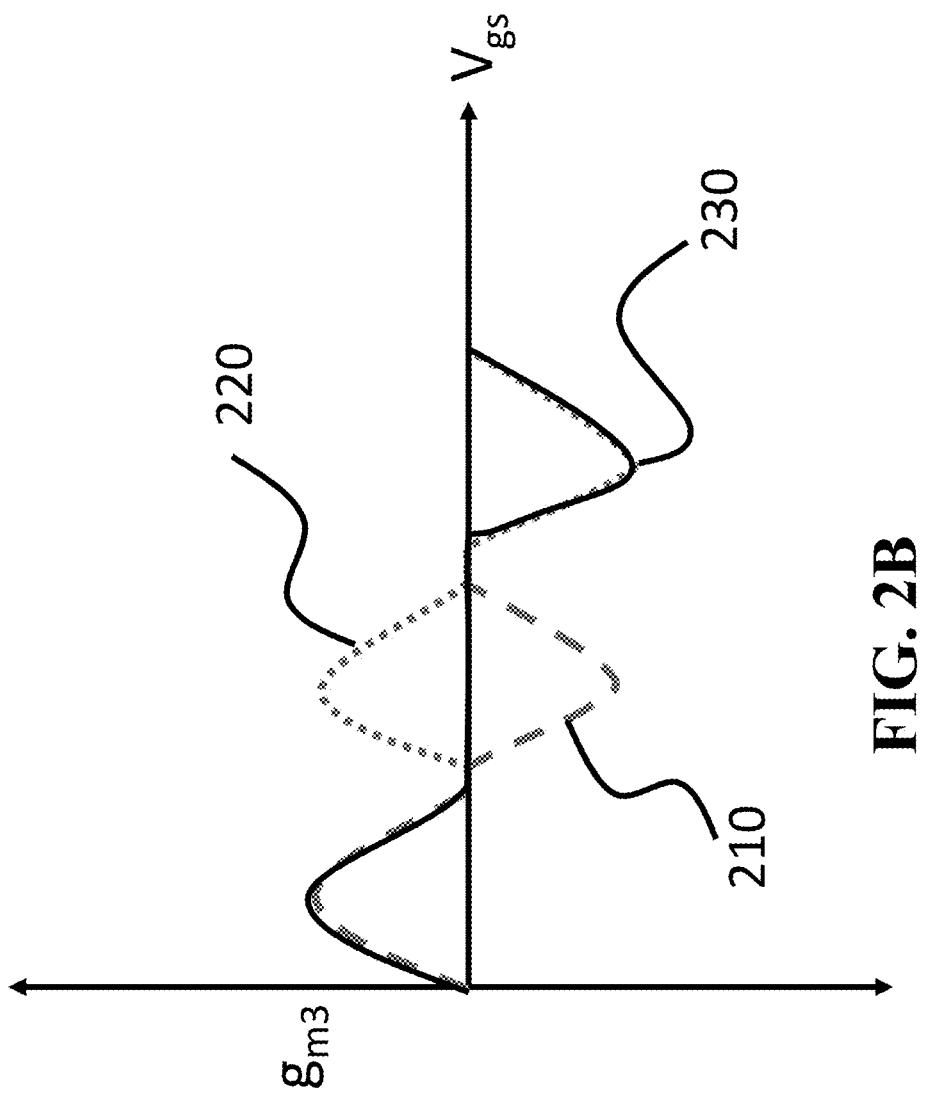

FIGS. 2A and 2B show plots illustrating how a gate electrode including multiple metal slabs arranged along the width of the device improves the linearity of a semiconductor device. $g_{m3}$ which is defined mathematically by the following expression $$g_{m3} = \frac{d^3 I_{DS}}{dV_{GS}^3},$$

is the hall mark of linearity of any transistor. The lower the magnitude to $g_{m3}$, the higher the linearity.

FIG. 2A shows a plot of gm3 vs gate voltage of a transistor. Things to be noticed in this curve is that any $g_{m3}$ curve would have one positive region (shaded) labeled 201 and one negative region (not-shaded) labeled 202. The transition from positive to negative region happens around the threshold voltage. The region labelled 203 in this figure is the ideal region for operation since it has gm3 value close to zero. However, the problem is the extension of this region along the $V_{gs}$ axis is very small making it almost impossible to operate the transistor in such a small gate voltage range.

FIG. 2B shows the gm3 vs $V_{gs}$ plots 210 and 220 for two virtual channel Ch-1 and Ch-2 shown respectively in FIG. 1D. Here, the threshold voltages (i.e. the work functions) of the channels are designed is such a way that negative region of gm3 curve of Ch-1 overlaps with the positive region of gm3 curve of Ch-2. Therefore, if we had a transistor that has only these two virtual channels we would have a gm3 curve like the one labeled 230. One thing to be noticed is that the gate voltage region over which gm3 value is zero or close to zero has been enhanced. This kind of destructive interference of gm3 is termed as "Derivative Superposition".

Figure 3:
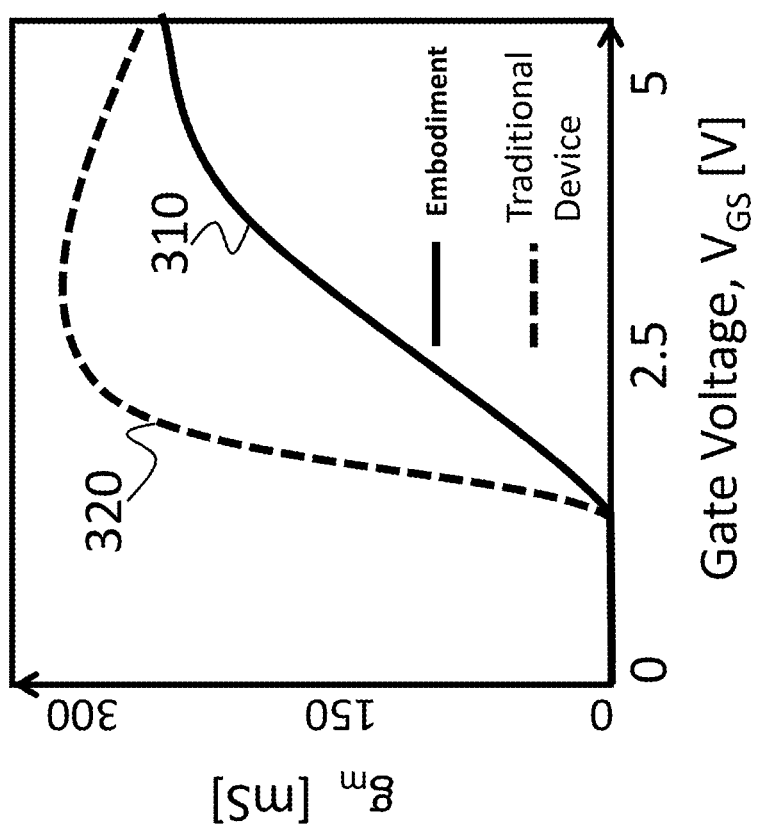
FIG. 3 shows the $g_m$ vs $V_{gs}$ curve for a transistor with homogeneous gate and a transistor with multiple metal gate according to some embodiments.

FIG. 3 shows the $g_m$ vs $V_{gs}$ curve for a transistor with homogeneous gate and a transistor with multiple metal gate according to some embodiments. Some embodiments are based on recognition that the linearity of a transistor depends on the rise of transconductance with respect to the gate voltage. A gradual increase of transconductance $g_m$ yields high linearity whereas a rapid increase of transconductance results in low linearity. As shown in this figure, the transconductance 310 of the transistor employing principles of some embodiments rises slowly compared to the transconductance 320 having a homogeneous gate. In this example, only five different metal slabs have been used. However, more metals yield even higher linearity.

Figure 4:
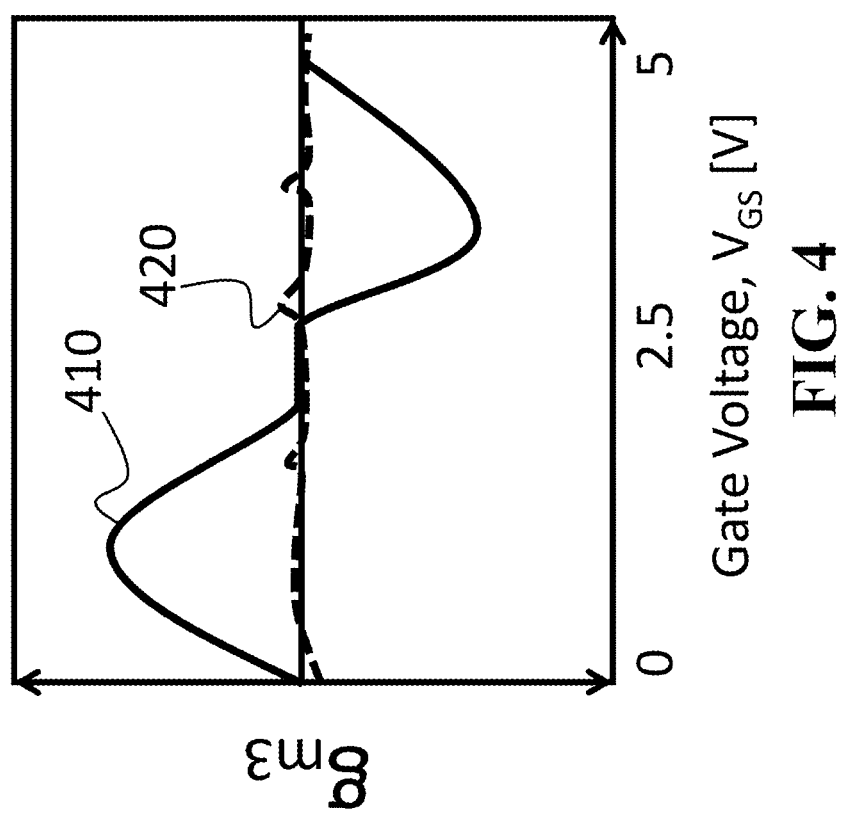
FIG. 4 shows a plot of gm3 vs $V_{gs}$ characteristics 410 of a transistor according to some embodiments.

FIG. 4 shows a plot of gm3 vs $V_{gs}$ characteristics 410 of a transistor according to some embodiments along with gm3 vs $V_{gs}$ characteristics 420 of a conventional HEMT. As mentioned earlier gm3 is the indicator of the linearity of a device—a higher linearity refers to the lower gm3. An ideal linear transistor should have gm3 very close to zero. From this example, it is quite evident that gm3 of the transistor according to some embodiments is less than the gm3 of conventional HEMT.

Figure 5:
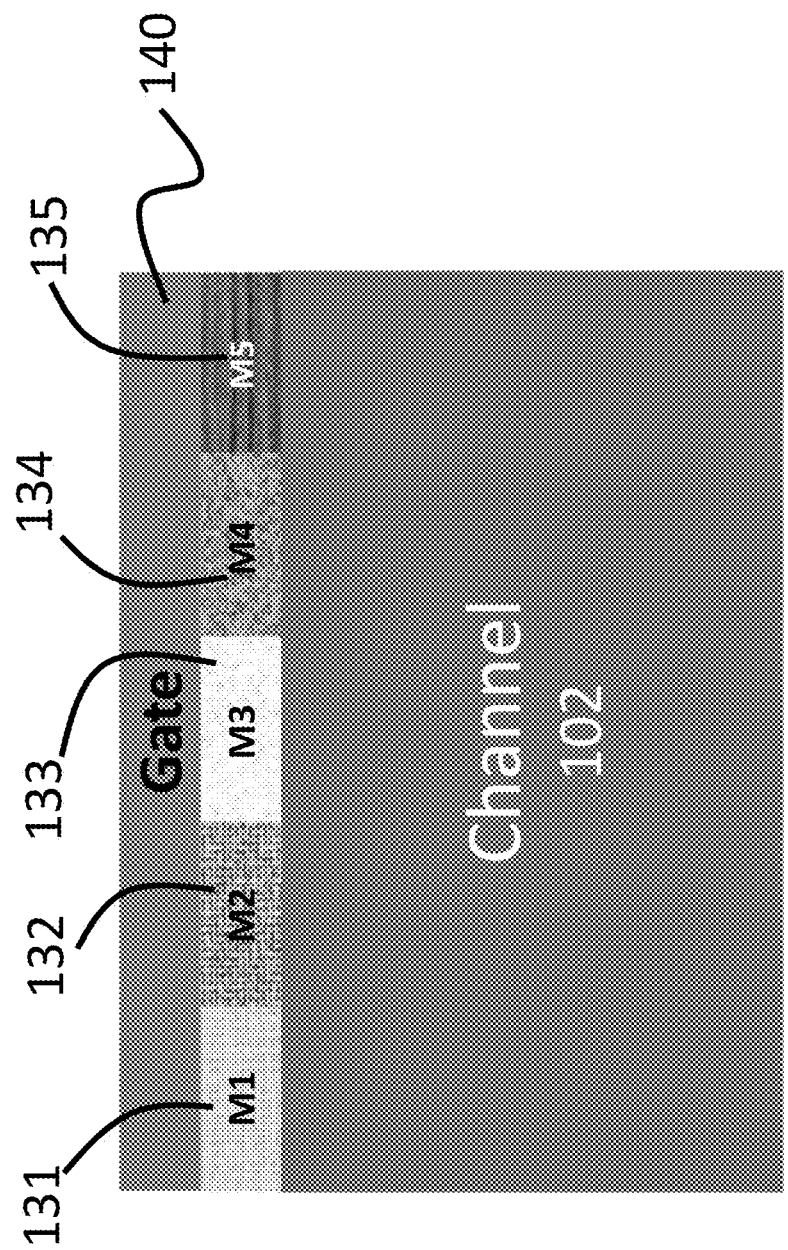
FIG. 5 shows the cross section along with the width of a multi metal gate transistor with a common metal slab deposited on top of the multiple metal slabs according to one embodiment.

FIG. 5 shows the cross section along with the width of a multi metal gate transistor with a common metal slab deposited on top of the multiple metal slabs according to one embodiment. The gate electrode 130 includes multiple metals 131-135 arranged along the width of the device and a common metal 140 deposited on top of the multiple metal slabs. The purpose of the common metal is to facilitate the gate electrode connection and protect the multiple metal slabs that forms the gate.

Figure 6:
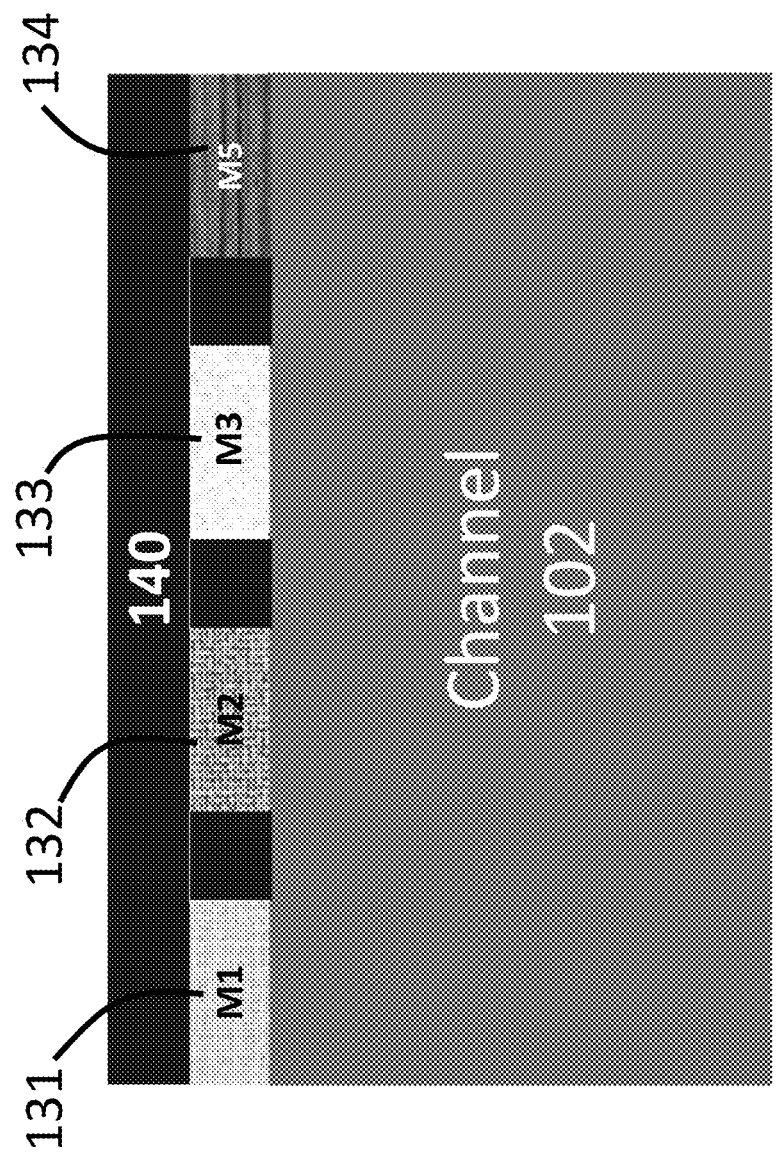
FIG. 6 shows a cross section view along the width of a transistor according to another embodiment.

FIG. 6 shows a cross section view along the width of a transistor according to another embodiment. In this embodiments, the gate stack includes multiple metal 131-134, however these metals do not touch each other. In order to facilitate the gate terminal connection a common metal 140 is deposited on top of multi-metal stack.

Figure 7:
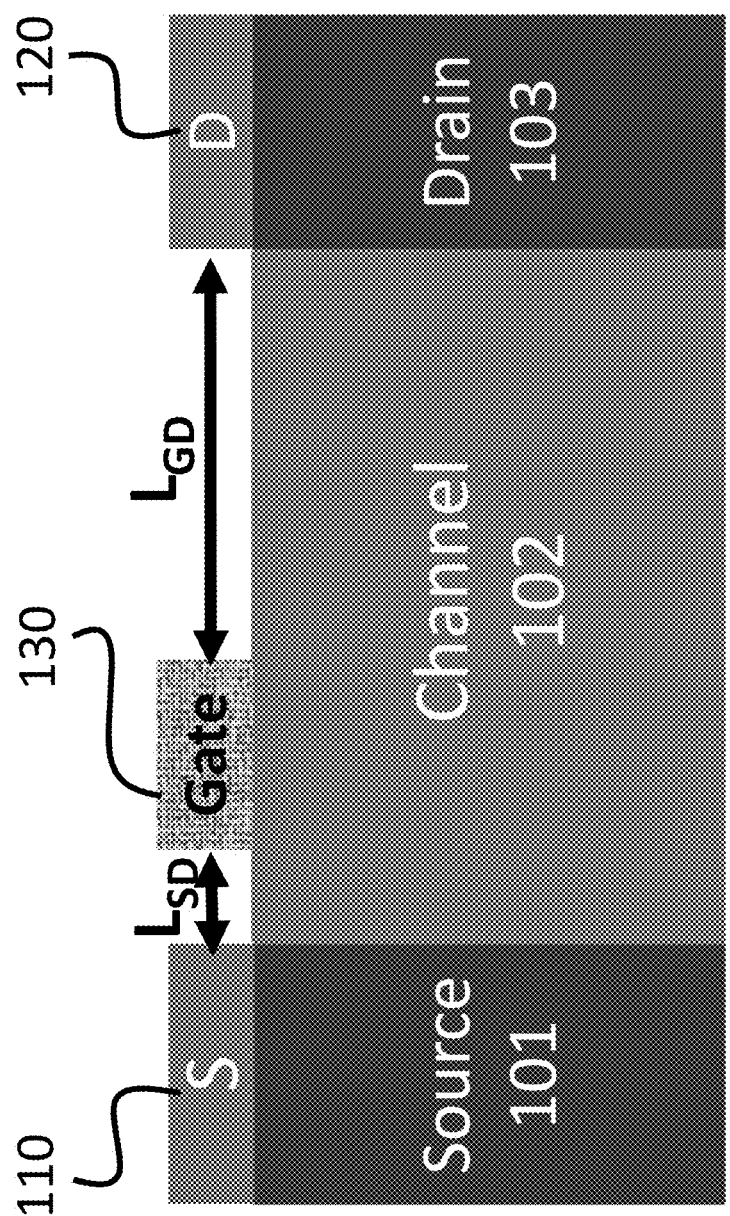
FIG. 7 shows the relative arrangement of source, gate and drain electrodes according to one embodiment.

FIG. 7 shows the relative arrangement of source, gate and drain electrodes according to one embodiment. In this embodiment, the distance between the source and the gate $L_{SD}$ is higher than the distance between the Gate and the Drain $L_{GD}$. In some implementations, $L_{SD}$ is as low as possible because high $L_{SD}$ increases source resistance which in turn decreases the linearity of the device. However, $L_{SD}$ cannot be made very small as it increases the parasitic capacitances which decreases cut off frequency. For most applications $L_{SD}$ is smaller than 500 nm.

$L_{GD}$ depends on the break down voltage of the device. Higher break down voltage needs higher $L_GD$. $L_GD$ also depends on the material property of the semiconductor that would be used to form the channel, a wide band gap material would give higher breakdown voltage at a relatively lower $L_{GD}$. For example if the breakdown voltage of the device is $V_{BR}$ then a GaN based device $$L_{GD} = \frac{V_{BR}}{100 \text{ V}} \text{ μm.}$$

The break-down voltage of any RF transistor has a direct relation with the maximum RF output power, $$P_{OUT} \sim \frac{1}{8} I_{DS \cdot max}(V_{BR} - V_{knee})^2.$$

Therefore, a high breakdown voltage gives higher output power.

Figure 8:
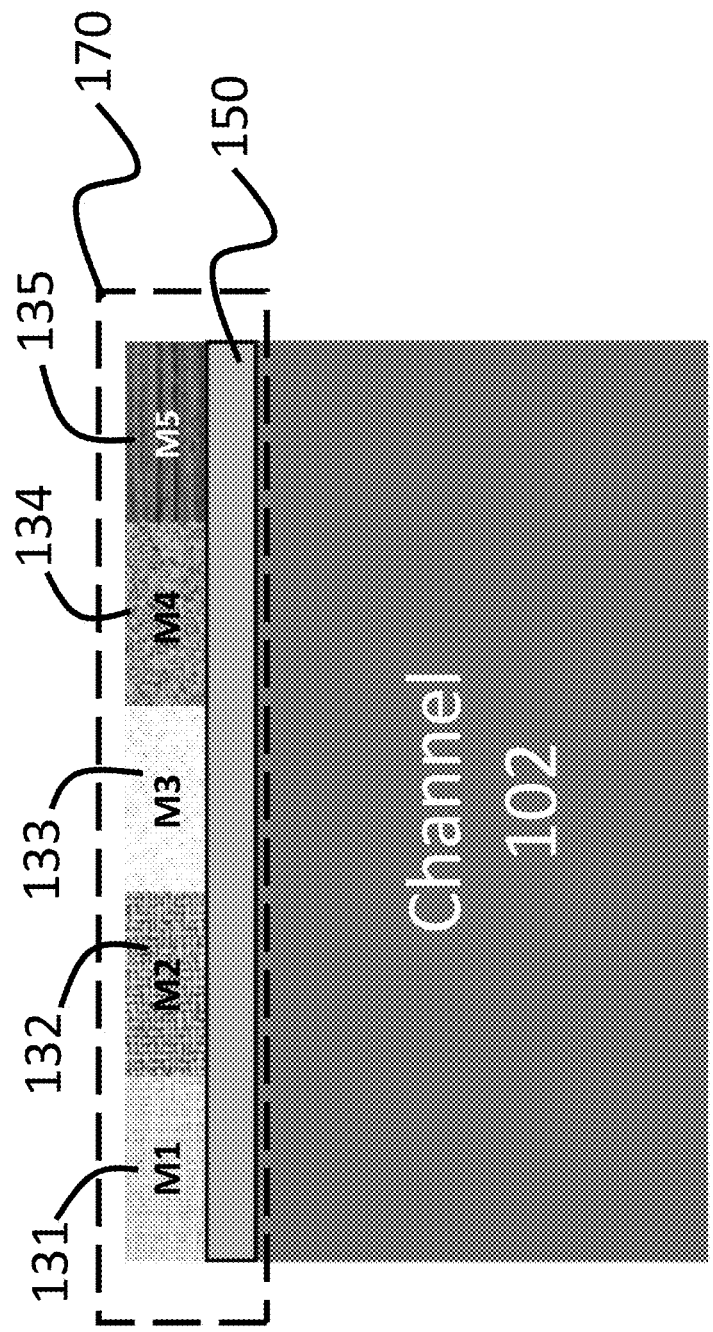
FIG. 8 shows the cross section of a transistor according to another embodiment.

FIG. 8 shows the cross section of a transistor according to another embodiment. In this embodiment, the gate stack 170 includes multiple metal slabs 131-135 for the gate contact and an oxide layer 150 is sandwiched between the multi-metal gate and the semiconductor layer. This oxide layer helps to reduce the gate leakage current and thus improve the maximum cut off frequency of the device. The material of region 150 can be dielectrics, $SiN_x$, $Al_2O_3$, $SiO_2$, $HfO_2$ and doped $HfO_2$.

Figure 9:
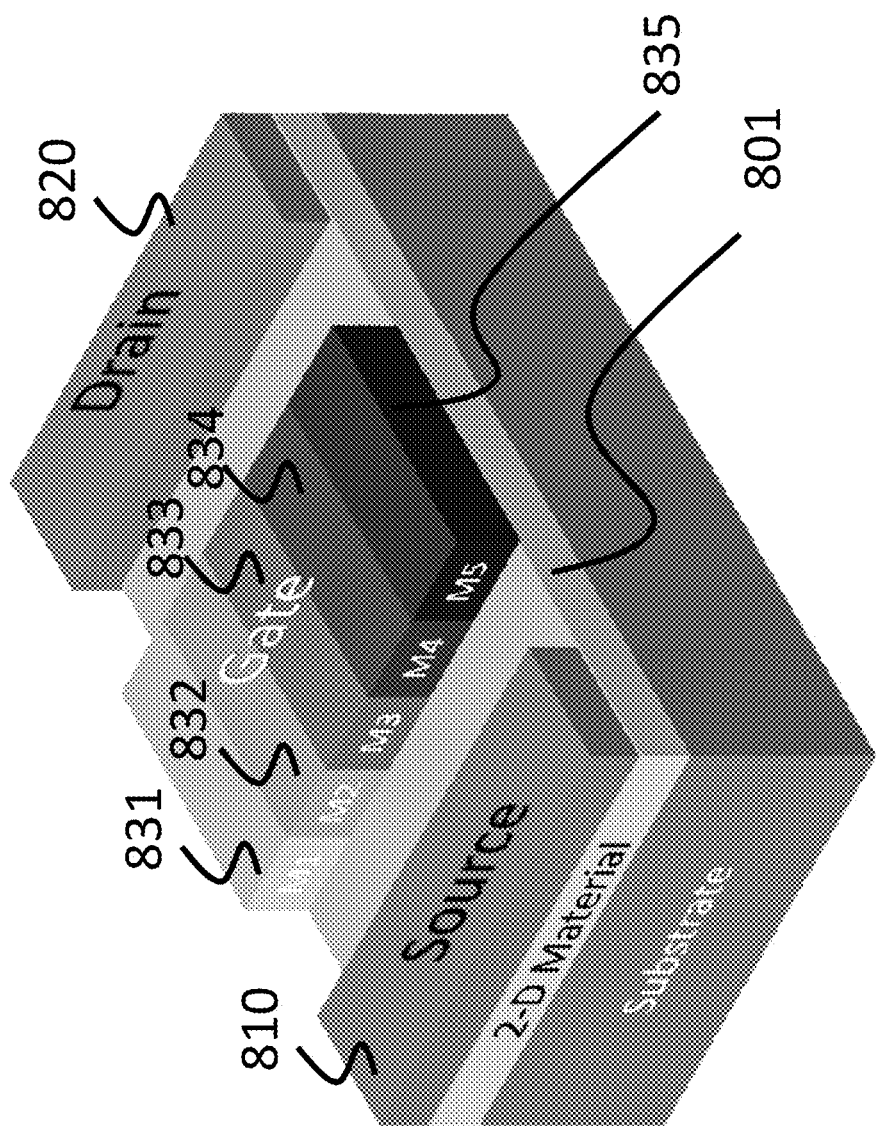
FIG. 9 shows the 3-D schematic of a semiconductor device with atomically thin two-dimensional (2-D) semiconductor layer 801 according to some embodiments.

FIG. 9 shows the 3-D schematic of a semiconductor device with atomically thin two-dimensional (2-D) semiconductor layer 801 according to some embodiments. The 2-D semiconductor layer 801 provides channel carrier. The gate stack 830 includes multiple metal slabs 831, 832, 833, 834, and 835 for the gate electrode. A source electrode 810 and a drain electrode 820 facilitate the current conduction. The 2-D semiconductor includes but not limited to graphene, MoS2, WSe2, TSe2, MoSSe, WSSe and so on. A dielectric layer including but not limited to SiO2, Al2O3, HfO2 can be inserted between the gate electrode and the 2-D semiconductor layer.

Figure 10A:
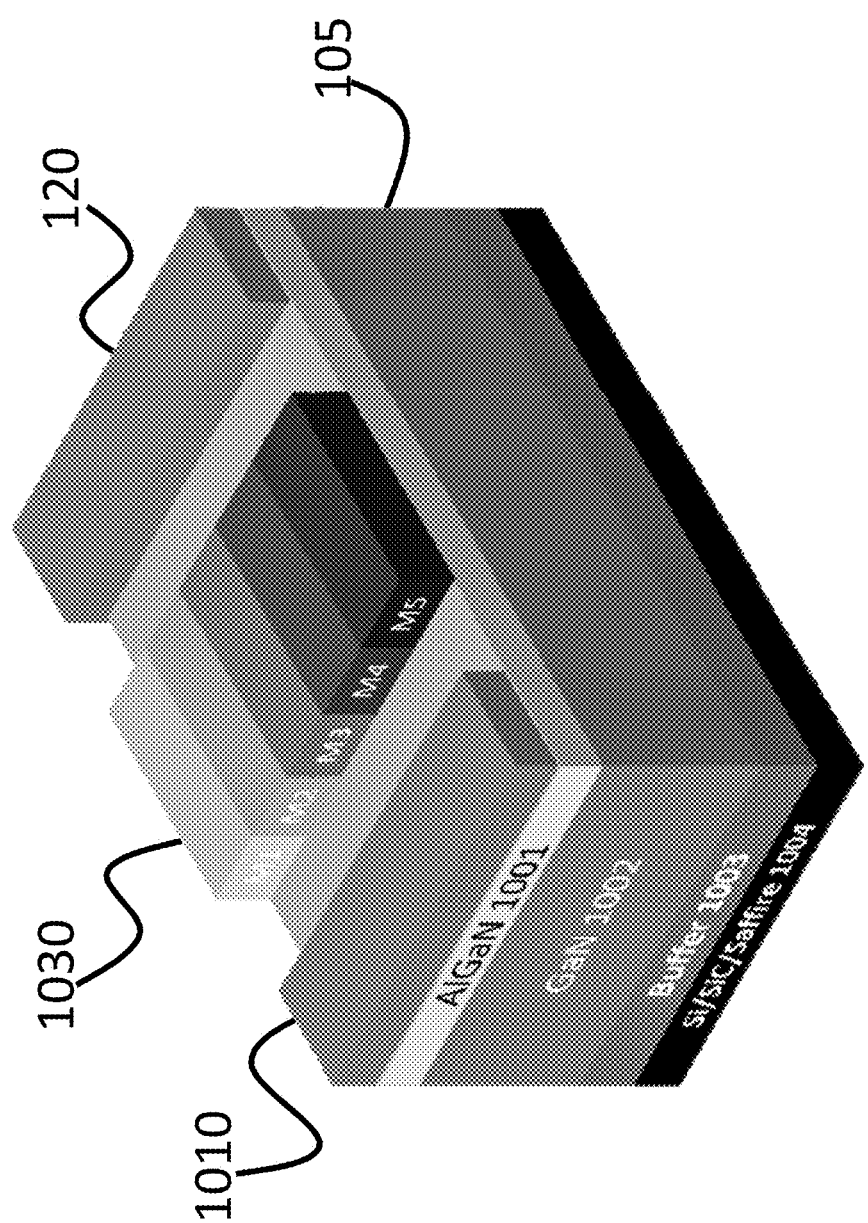
FIG. 10A shows the 3-D schematic of a multi-metal gate transistor with III-V semiconductor hetero-structure to form a carrier channel according to one embodiment.

FIG. 10A shows the 3-D schematic of a multi-metal gate transistor with III-V semiconductor hetero-structure to form a carrier channel according to one embodiment. In this embodiment, the semiconductor structure includes a cap layer 1001 and a channel layer 1002 to form a hetero-structure forming a carrier channel as a two-dimensional-electron-gas (2-DEG). A transistor with 2-DEG as the carrier channel also known as high electron mobility transistor (HEMT) since the mobility of electrons in 2-DEG is extremely high due to Quantum Confinement and reduced lattice scattering.

The band-gap of the semiconductor in the cap layer is higher than the band gap of the semiconductor forming the channel layer. The semiconductor device also includes a set of electrodes for providing and controlling carrier charge in the carrier channel. For example, the set of electrodes can include at least one source electrode 1010 transmitting an electronic charge through the carrier channels, on drain electrode 1020 receiving the electronic charge and one gate electrode 1030 for controlling the conduction of carrier charge. The gate electrode has multiple metal slabs distributed along the width of the device. In some implementations, the semiconductor structure includes multiple hetero-structures forming multiple carrier channel.

Figure 10B:
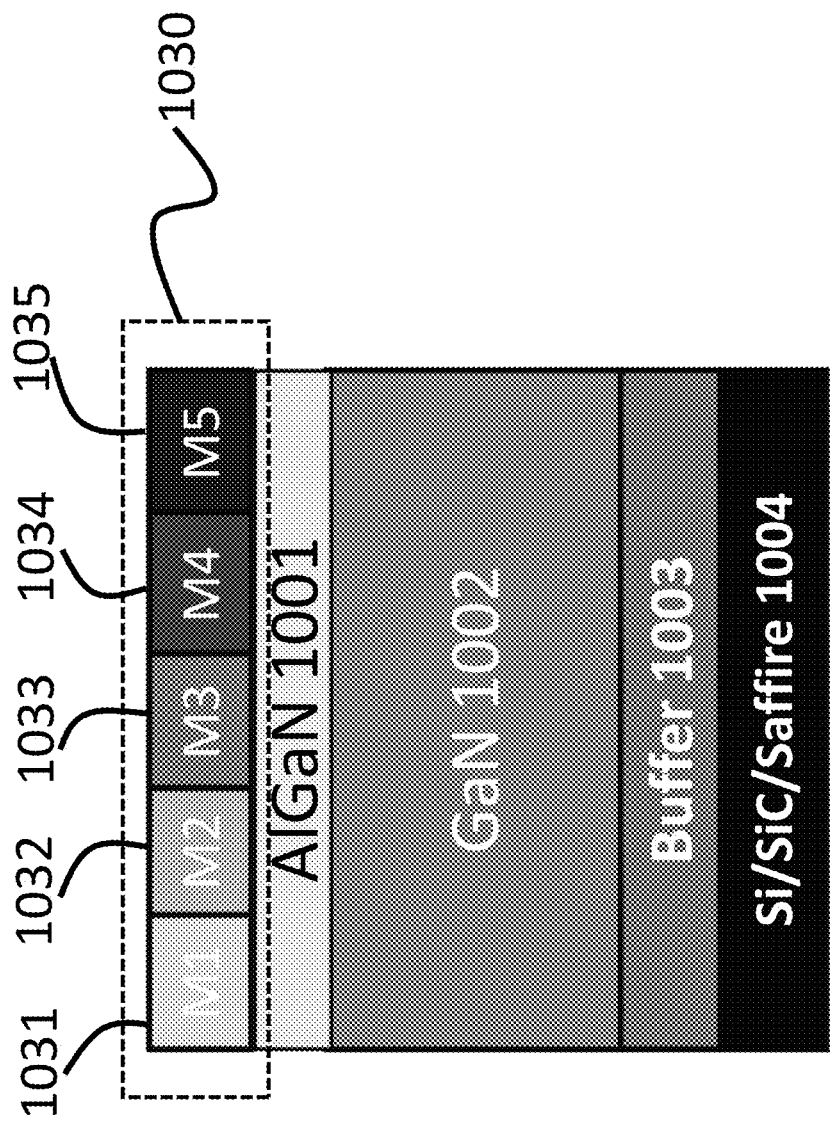
FIG. 10B shows the cross section view along the width of a multi-metal gate transistor with III-V semiconductor hetero-structure to form a carrier channel according to some embodiments.

FIG. 10B shows the cross section view along the width of a multi-metal gate transistor with III-V semiconductor hetero-structure to form a carrier channel according to some embodiments. The gate electrode 1030 includes multiple metal slabs 1031, 1032, 1033, 1034, and 1035. The semiconductor device can also include other layers e.g. a buffer layer 1003, a substrate 1004.

Figures 11A, 11B:
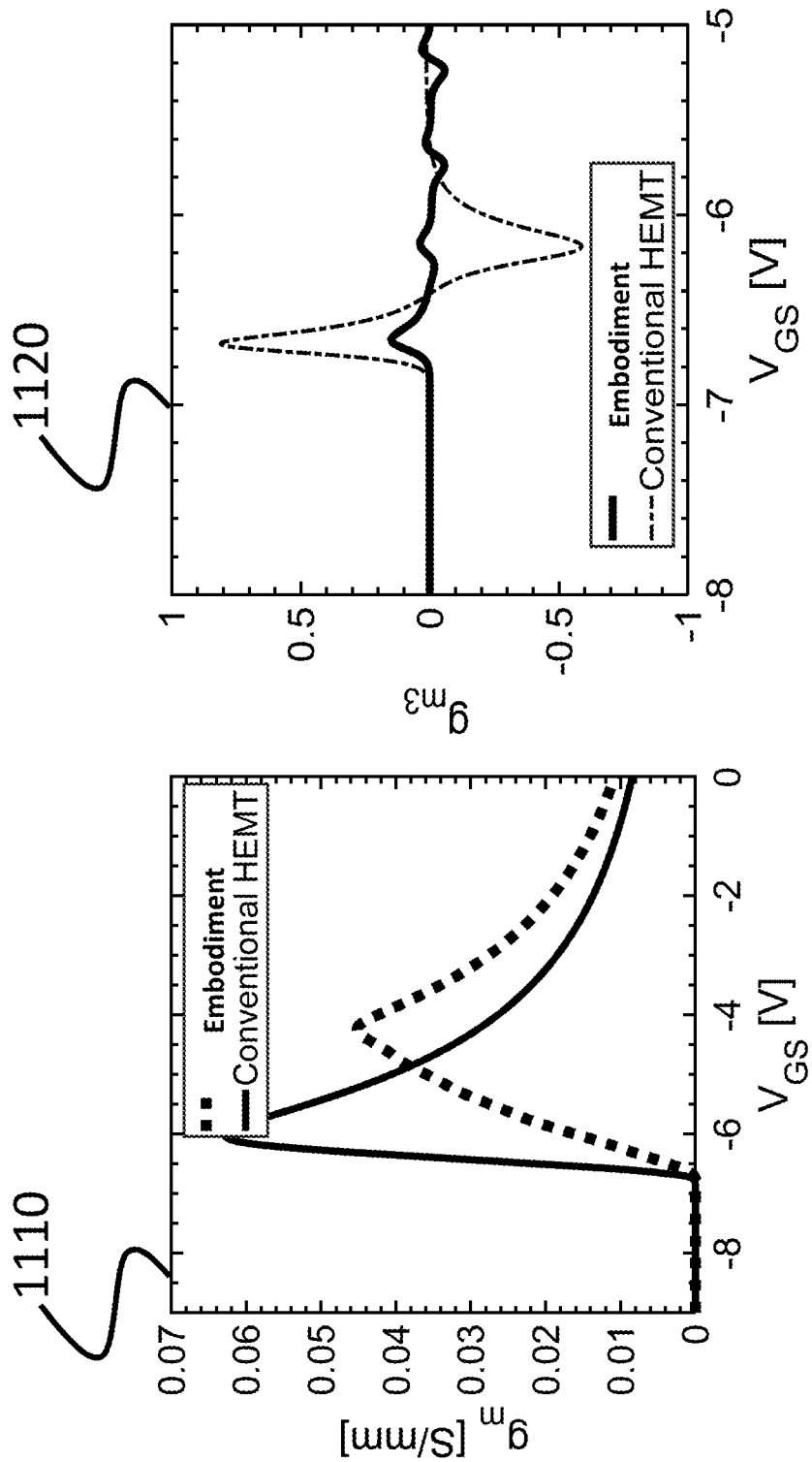
FIGS. 11A and 11B show the simulation results of HEMT with multiple metal gate according to some embodiments.

FIGS. 11A and 11B show the simulation results of HEMT with multiple metal gate according to some embodiments. FIG. 11A shows a plot 1010 of gm vs Vgs demonstrating that the $g_m$ of the transistor according to some embodiments rises slowly with respect to gate voltage compared to the gm of a conventional HEMT; which attests to the high linearity of the invented device. Another important device parameter which speaks for the linearity of a transistor is gm3; a lower magnitude of gm3 refers to the high linearity of a transistor.

FIG. 11B shows a plot 1020 of gm3 of the invented device along with traditional HEMT, exhibiting that the gm3 of the transistor according to some embodiments is zero or close to zero for a very wide range of gate voltage.

Figure 12:
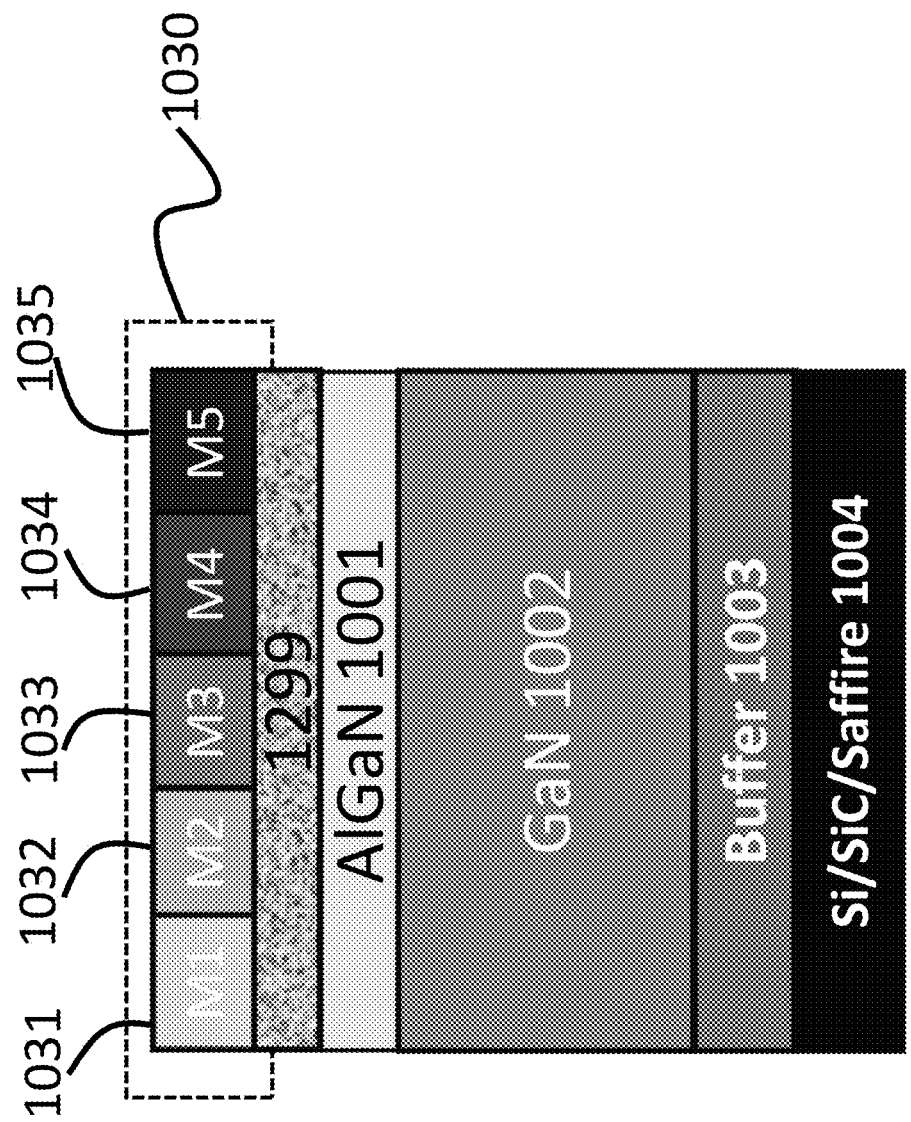
FIG. 12 shows a cross-section along the width of a multiple metal gate HEMT according to some embodiments.

FIG. 12 shows a cross-section along the width of a multiple metal gate HEMT according to some embodiments. In those embodiments, a layer 1299 is sandwiched between the gate electrode with multiple metals and the cap-layer 1001. According to one embodiment, the layer 1299 is a dielectric layer to form a Metal-Insulator-Semiconductor (MIS) or a MOS gate stack. In this embodiment the materials of region 1299 can include but is not limited to silicon di-oxide (SiO2), silicon nitride (SixNy), silicon oxide nitride hydrogen ($Si_xO_yN_zH_w$), aluminum oxide (Al2O3), hafnium oxide (HfO2). The dielectric region layer 1299 can be formed as a passivation layer.

In some other embodiments, the layer 1299 could be a semiconductor layer wherein the semiconductor layer is p-type doped. In this case the semiconductor layer 1299 may include but is not limited to GaN, AlGaN, AlN, Diamond and so on. Such an arrangement would provide a normally off operation.

Figure 13:
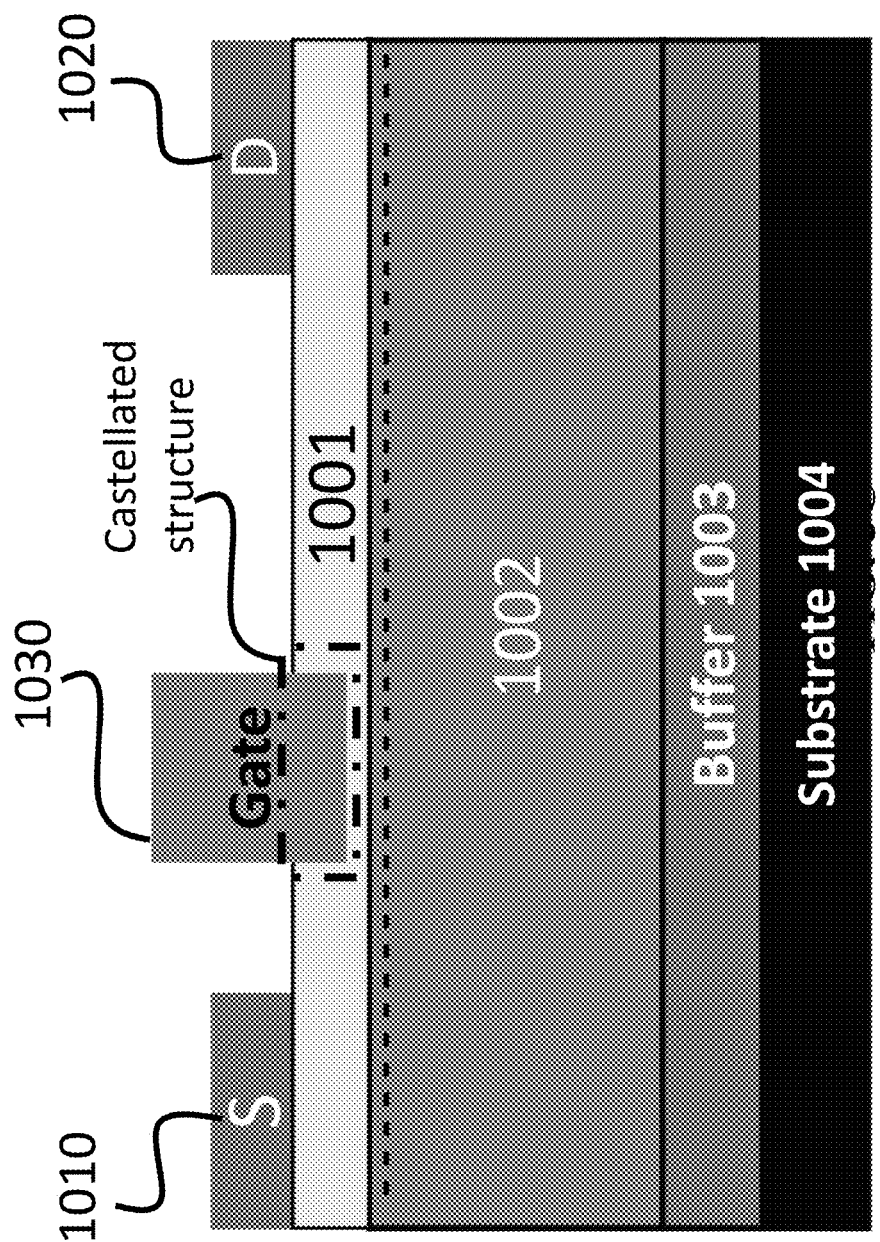
FIG. 13 shows cross section view of the castellated gate HEMT structure with multi-metal gate electrode according to one embodiment.

FIG. 13 shows cross section view of the castellated gate HEMT structure with multi-metal gate electrode according to one embodiment. The castellated structure is formed by etching away at least partially the cap layer region 1001 so that the gate metal is in proximity to the 2-DEG channel 1007. Such an arrangement would enhance the gate capacitance, which in turn offers normally off operation. The etching of cap layer can be performed either by wet etching or by dry etching. According to another embodiment a dielectric layer is sandwiched between the multimetal gate electrode and the castellated semiconductor structure to reduce the gate leakage current.

Figure 14:
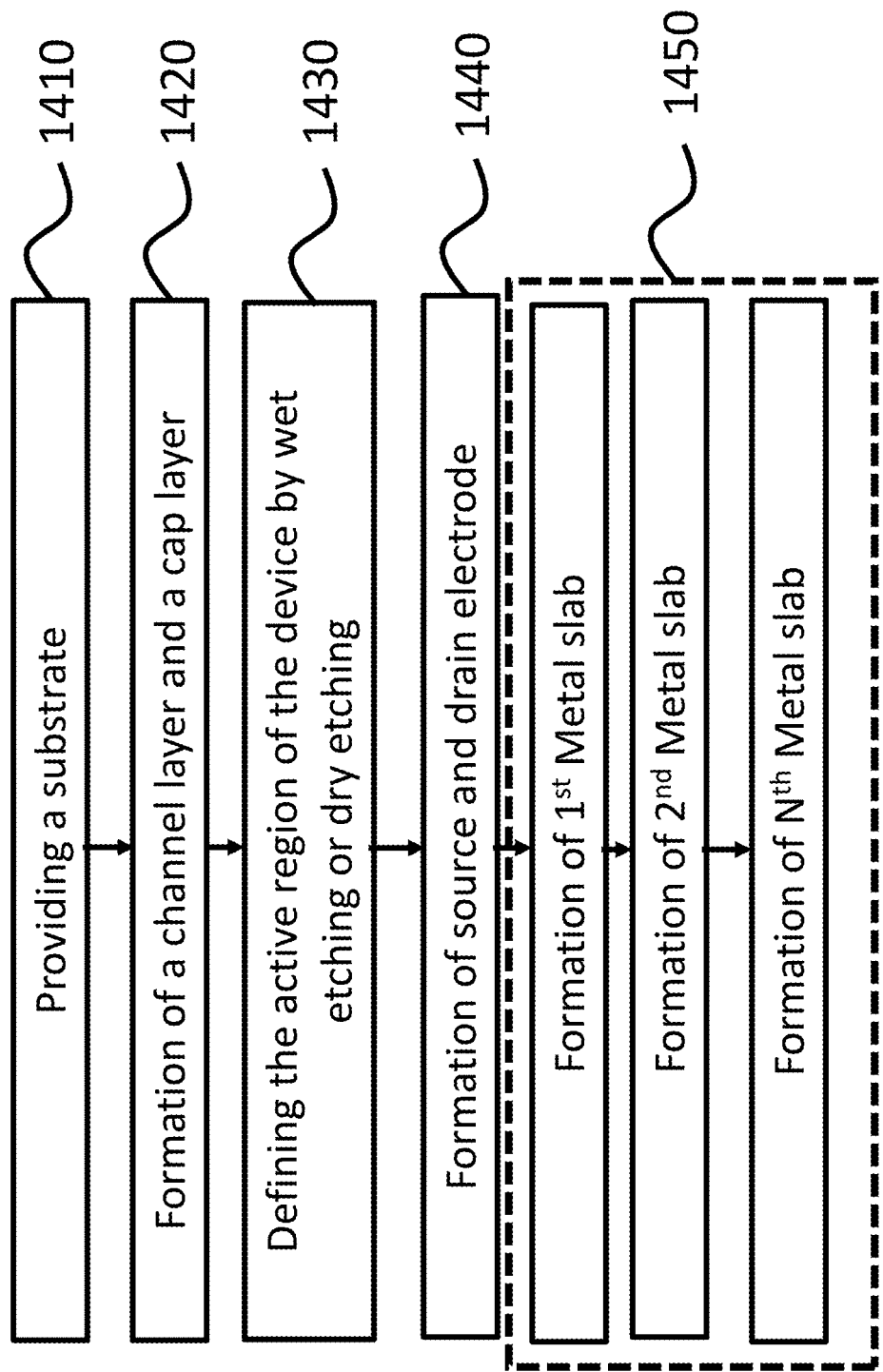
FIG. 14 shows the block diagram of a method for fabricating a semiconductor device according to some embodiments.

FIG. 14 shows the block diagram of a method for fabricating a semiconductor device according to some embodiments. The method includes providing substrate 1410, making 1420 a semiconductor structure comprising at least a III-V channel layer forming a carrier channel in the semiconductor structure. The material of top barrier layer has a higher bandgap than the bandgap of material in the III-V channel layer. According to some embodiments, various methods can be adopted for the growth and formation of top barrier layer or channel layer, including but not limited to a Chemical Vapor Deposition (CVD), a Metal-Organic-Chemical-Vapor-Deposition (MOCVD), a Molecular Beam Epitaxy (MBE), a Metal-Organic Vapor Phase Epitaxy (MOVPE) and a Plasma Enhanced Chemical Vapor Deposition (PECVD) and a microwave plasma deposition system.

The method then includes, defining the active region of the transistor by wet etching or dry etching 1430. Further the method also includes 1440, formation of source and the drain electrode to electrically connect to the carrier channel using one or combination of an ebeam deposition, a joule evaporation, a chemical vapor deposition and a sputtering process. Then the sample is annealed >800° C. in vacuum or N2 environment to form the ohmic contact.

Further method also includes 1450, the formation of first metal slab for the gate electrode. The formation of this metal slab can be done using one or combination of Lithography→Metal Deposition→Lift-off and Metal deposition-→Lithography→Etching.

Here the lithography could be performed using, including but not limited to photo-lithography, electron-beam lithography. Metal deposition can be done using one or combination of an ebeam deposition, a joule evaporation, a chemical vapor deposition and a sputtering process.

After the formation of first metal slab repeat the same process and form the second metal slab and continue repeating the process until all the metal slabs are formed and the gate electrode is complete.

Although the invention has been described by way of examples of preferred embodiments, it is to be understood that various other adaptations and modifications can be made within the spirit and scope of the invention. Therefore, it is the objective of the appended claims to cover all such variations and modifications as come within the true spirit and scope of the invention.

We claim:

1. A radio frequency (RF) transistor, comprising:
   a semiconductor structure;
   a source electrode and a drain electrode arranged on the semiconductor structure;
   a gate electrode extending between the source electrode and the drain electrode along a length of the transistor, wherein the gate electrode includes at least two slabs of different metals arranged adjacent to each other along a width of the gate electrode of the transistor, wherein the different metals of the slabs have different workfunctions selected such that, in response to applying a voltage to the gate electrode for an operation of the transistor, the different metals form along the length of the transistor at least a first virtual channel having a first third order transconductance (gm3) curve and a second virtual channel having a second gm3 curve in destructive interference with the first gm3 curve, wherein the destructive interference extends a linear region for operation of each of the different metal, such that a combined linear region for operation of the different metals is wider than a sum of each individual ideal region of operation for each individual metal, such that the combined linear region after the destructive interference of the first gm3 curve with the second gm3 curve is wider than a sum of linear regions of the first gm3 curve and the second gm3 curve before the destructive interference, wherein the semiconductor structure includes multiple layers forming a carrier channel passing carriers from the source electrode to the drain electrode when the voltage is applied to the gate electrode, such that the transistor is a high electron mobility transistor (HEMT); and an oxide layer arranged on top of the semiconductor structure, wherein the slabs of different metals are arranged on top of the oxide layer.

2. The transistor of claim 1, wherein the slabs have different gate-width.

3. The transistor of claim 1, wherein the slabs touch each other along sides of the slabs forming a gate-length.

4. The transistor of claim 1, wherein a distance between the source electrode and the gate electrode is greater than a distance between the gate electrode and the drain electrode.

5. The transistor of claim 1, wherein the gate electrode includes a set of more than two different metals having different work-functions to form a set of more than two virtual channels having different threshold voltages connecting the source electrode and the drain electrode, such that the set of virtual channels operated by the same gate electrode increase linearity of the transistor.

6. The transistor of claim 1, wherein the slabs of different metals are arranged such that the work functions of the different metals gradually vary along the width of the gate electrode.

7. The transistor of claim 1, wherein the semiconductor structure is a hetero-structure including a cap layer and a channel layer to form a carrier channel between the source electrode and the drain electrode as a two dimensional electron gas (2-DEG).

8. The semiconductor device of claim 7, wherein the material of the channel layer includes one or combination of gallium nitride (GaN), indium gallium nitride (InGaN), gallium arsenide (GaAs), and indium gallium arsenide (InGaAs), and wherein the material of the cap layer includes one or combination of aluminum gallium nitride (AlGaN), indium gallium nitride (InGaN), aluminum nitride (AlN), aluminum gallium arsenide (AlGaAs), aluminum arsenide (AlAs), and indium aluminum gallium arsenide (InAlGaAs).

9. The semiconductor device of claim 7, wherein a oxide layer is sandwiched between the gate electrode and the cap layer.

10. The semiconductor device of claim 7, wherein cap layer beneath the gate electrode is etched away at least partially.

11. The semiconductor device of claim 7, wherein the semiconductor structure includes multiple heterostructures forming multiple carrier channel.

* * * * *